(12) United States Patent
Sabathil et al.

(10) Patent No.: US 9,029,878 B2
(45) Date of Patent: May 12, 2015

(54) LIGHTING DEVICE

(75) Inventors: Matthias Sabathil, Regensburg (DE); Norwin von Malm, Nittendorf-Thumhausen (DE); Lutz Hoeppel, Alteglofsheim (DE); Stefan Illek, Donaustauf (DE); Bernd Barchmann, Regensburg (DE); Patrick Rode, Regensburg (DE)

(73) Assignee: OSRAM Opto Semiconductors GmbH (DE)

(*) Notice: Subject to any disclaimer, the term of this patent is extended or adjusted under 35 U.S.C. 154(b) by 65 days.

(21) Appl. No.: 13/522,508

(22) PCT Filed: Jan. 17, 2011

(86) PCT No.: PCT/EP2011/050541
§ 371 (c)(1),
(2), (4) Date: Sep. 24, 2012

(87) PCT Pub. No.: WO2011/092072
PCT Pub. Date: Aug. 4, 2011

(65) Prior Publication Data
US 2013/0043496 A1 Feb. 21, 2013

(30) Foreign Application Priority Data

Jan. 29, 2010 (DE) .......................... 10 2010 006 135
Apr. 26, 2010 (DE) .......................... 10 2010 018 260

(51) Int. Cl.
*H01L 33/08* (2010.01)
*H01L 25/075* (2006.01)
(Continued)

(52) U.S. Cl.
CPC ............. *H01L 25/0753* (2013.01); *H01L 33/22* (2013.01); *H01L 33/507* (2013.01); *H01L 33/58* (2013.01); *H01L 33/62* (2013.01); *H01L 2924/0002* (2013.01)

(58) Field of Classification Search
CPC ............ H01L 25/0753; H01L 2924/00; H01L 2924/0002; H01L 33/22
USPC ........ 257/88, 98, 99, E33.075; 362/555, 23.1
See application file for complete search history.

(56) References Cited

U.S. PATENT DOCUMENTS 5,469,020 A 11/1995 Herrick
6,245,259 B1 * 6/2001 Hohn et al. .............. 252/301.36
(Continued)

FOREIGN PATENT DOCUMENTS

CN 1716041 1/2006
CN 1993638 7/2007
(Continued)

OTHER PUBLICATIONS

English translation of Japanese Notice of Reasons for Rejection dispatched Aug. 19, 2014 from corresponding Japanese Patent Application No. 2012-550388.

*Primary Examiner* — Thinh T Nguyen
(74) *Attorney, Agent, or Firm* — DLA Piper LLP (US)

(57) ABSTRACT

A lighting device with front carrier, rear carrier and plurality of light-emitting diode chips, which when in operation emits light and releases waste heat, wherein rear carrier is covered at least in selected locations by front carrier, light-emitting diode chips are arranged between rear carrier and front carrier to form array, light-emitting diodes are contacted electrically by rear and/or front carrier and immobilized mechanically by rear carrier and front carrier, front carrier is coupled thermally conductively to light-emitting diode chips and includes light outcoupling face remote from light-emitting diode chips, which light outcoupling face releases some of waste heat released by light-emitting diode chips into surrounding environment, each light-emitting diode chip is actuated with electrical nominal power of 100 mW or less when lighting device is in operation and has light yield of 100 lm/W or more.

15 Claims, 5 Drawing Sheets

(51) Int. Cl.
*H01L 33/22* (2010.01)
*H01L 33/50* (2010.01)
*H01L 33/58* (2010.01)
*H01L 33/62* (2010.01)

(56) References Cited

U.S. PATENT DOCUMENTS

| | | | |
|---|---|---|---|
| 6,340,824 B1 * | 1/2002 | Komoto et al. | 257/99 |
| 6,473,554 B1 | 10/2002 | Pelka et al. | |
| 6,888,237 B1 * | 5/2005 | Guenther | 257/704 |
| 7,052,152 B2 * | 5/2006 | Harbers et al. | 362/30 |
| 7,217,956 B2 | 5/2007 | Daniels et al. | |
| 7,476,557 B2 * | 1/2009 | Daniels et al. | 438/22 |
| 7,740,376 B2 * | 6/2010 | Wuu et al. | 362/249.04 |
| 2005/0212406 A1 | 9/2005 | Daniels et al. | |
| 2005/0265029 A1 * | 12/2005 | Epstein et al. | 362/339 |
| 2007/0290217 A1 * | 12/2007 | Daniels | 257/88 |
| 2008/0123355 A1 * | 5/2008 | Wuu et al. | 362/419 |
| 2008/0191220 A1 | 8/2008 | Daniels et al. | |
| 2010/0301378 A1 | 12/2010 | Lanchava et al. | |

FOREIGN PATENT DOCUMENTS

| | | |
|---|---|---|
| DE | 10 2007 043 401 A1 | 3/2009 |
| DE | 10 2008 005 935 A1 | 6/2009 |
| JP | 2007-95674 | 4/2007 |
| JP | 2007-180022 | 7/2007 |
| JP | 2007-200877 | 8/2007 |
| JP | 2007-531321 | 11/2007 |
| WO | 2004/051705 A2 | 6/2004 |
| WO | 2008/131735 A1 | 11/2008 |
| WO | 2009/067991 A2 | 6/2009 |

* cited by examiner

LIGHTING DEVICE

RELATED APPLICATIONS

This is a §371 of International Application No. PCT/EP2011/050541, with an international filing date of Jan. 17, 2011 (WO 2011/092072 A1, published Aug. 4, 2011), which is based on German Patent Application Nos. 10 2010 006 135.2, filed Jan. 29, 2010, and 10 2010 018 260.5, filed Apr. 26, 2010, the subject matter of which is incorporated by reference.

TECHNICAL FIELD

This disclosure relates to a lighting device.

Lighting devices are known such as from U.S. Pat. No. 7,217,956 B2.

It could nonetheless be helpful to provide a lighting device which manages without complex cooling measures while ensuring satisfactorily uniform brightness distribution.

SUMMARY

We provide a lighting device with a front carrier, a rear carrier and a plurality of light-emitting diode chips, which when in operation emits light and releases waste heat, wherein the rear carrier is covered at least in selected locations by the front carrier, the light-emitting diode chips are arranged between the rear carrier and the front carrier to form an array, the light-emitting diodes are contacted electrically by the rear and/or the front carrier and immobilized mechanically by the rear carrier and the front carrier, the front carrier is coupled thermally conductively to the light-emitting diode chips and includes a light outcoupling face remote from the light-emitting diode chips, which light outcoupling face releases some of the waste heat released by the light-emitting diode chips into the surrounding environment, each light-emitting diode chip is actuated with an electrical nominal power of 100 mW or less when the lighting device is in operation and has a light yield of 100 lm/W or more, distances between mutually adjacent light-emitting diode chips are sufficiently large for the array formed by the light-emitting diode chips to have an electrical power consumption relative to its base, on actuation of the light-emitting diode chips with the electrical nominal power, of less than or equal to 450 W/m$^2$, when the lighting device is in operation, and distances between mutually adjacent light-emitting diode chips are sufficiently small for the array formed by the light-emitting diode chips to emit light, in plan view onto the light outcoupling face, with an average luminance of greater than or equal to 2000 Cd/m$^2$, on actuation of the light-emitting diode chips with the electrical nominal power when the lighting device is in operation and distances between mutually adjacent light-emitting diode chips are less than or equal to 2.5 times a distance between the light outcoupling face and the light-emitting diode chips.

We also provide a lighting device with a front carrier, a rear carrier and a plurality of light-emitting diode chips, which when in operation emits light and releases waste heat, wherein the rear carrier is covered at least in selected locations by the front carrier, the light-emitting diode chips are arranged between the rear carrier and the front carrier to form an array, the light-emitting diodes are contacted electrically by the rear and/or the front carrier and immobilized mechanically by the rear carrier and the front carrier, the front carrier is coupled thermally conductively to the light-emitting diode chips and includes a light outcoupling face remote from the light-emitting diode chips, which light outcoupling face releases some of the waste heat released by the light-emitting diode chips into the surrounding environment, each light-emitting diode chip is actuated with an electrical nominal power of 100 mW or less when the lighting device is in operation and has a light yield of 100 lm/W or more, distances between mutually adjacent light-emitting diode chips are sufficiently large for the array formed by the light-emitting diode chips to have an electrical power consumption relative to its base, on actuation of the light-emitting diode chips with the electrical nominal power, of less than or equal to 450 W/m$^2$, when the lighting device is in operation, distances between mutually adjacent light-emitting diode chips are sufficiently small for the array formed by the light-emitting diode chips to emit light, in plan view onto the light outcoupling face, with an average luminance of greater than or equal to 2000 Cd/m$^2$, on actuation of the light-emitting diode chips with the electrical nominal power when the lighting device is in operation and distances between mutually adjacent light-emitting diode chips are less than or equal to 2.5 times a distance between the light outcoupling face and the light-emitting diode chips, the front carrier includes a light-transmitting main body having a plurality of mutually separate cavities, wherein the front carrier encloses the cavities completely, and in plan view each cavity completely covers one of the light-emitting diode chips and contains a luminescence conversion element with a luminescent material.

DETAILED DESCRIPTION

Figure 1:
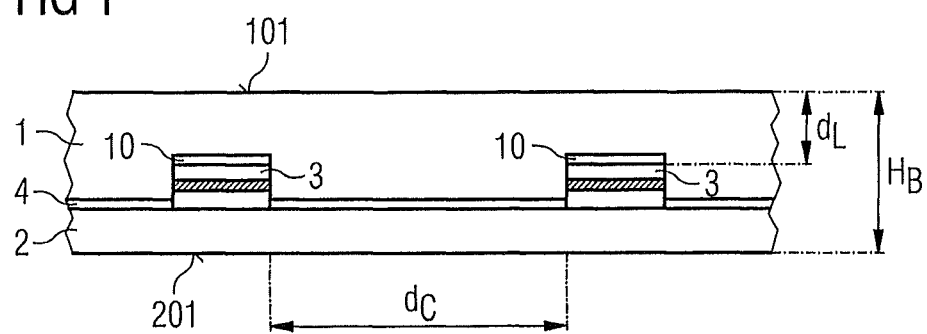
FIG. 1 shows a schematic cross-section through a portion of a lighting device according to a first example.

We provide a lighting device. The lighting device is, for example, an area light source. The lighting device may be designed for general lighting. Alternatively, it may, for example, constitute a backlighting device, in particular a frameless backlighting device, for example, for an LCD (Liquid Crystal Display).

The lighting device comprises a plurality of light-emitting diode chips. The light-emitting diode chips are designed to emit light, in particular ultraviolet, visible and/or infrared light, and to emit waste heat. In particular, only the emission of light is desired. When the lighting device is in operation, the light-emitting diode chips thus emit light in particular and release waste heat. In one configuration, the light-emitting diode chips are arranged in an array, for example, at the grid points of an imaginary hexagonal, rectangular or square grid.

The light-emitting diodes may all emit light at the same dominant wavelength. Alternatively, the lighting device may comprise several types of light-emitting diode chips with differing dominant wavelengths arranged in regular or irregular patterns in the array.

The light-emitting diode chips preferably comprise an inorganic semiconductor layer sequence designed to generate light. It is also feasible for the light-emitting diode chips to contain an organic layer sequence for radiation generation such that they constitute OLEDs. As an alternative to light-emitting diode chips, laser diode chips may in principle also be used.

The lighting device may comprise a front carrier and a rear carrier. In plan view onto the front of the lighting device, the rear carrier is covered at least in places by the front carrier. The front carrier and/or the rear carrier each may comprise a sheet or film, in particular a substantially plane-parallel sheet or film which may be provided, for example, with patterning to influence light outcoupling and/or electrical connection layers such as conductor tracks. The front carrier and the rear carrier may be of flexible construction. In this case, the lighting device in particular is flexible.

The light-emitting diode chips are arranged between the rear carrier and the front carrier and in particular immobilized mechanically thereby. In this way, the front carrier and preferably also the rear carrier are coupled to the light-emitting diode chips, particularly thermally conductively. For example, the light-emitting diode chips are soldered or adhesively bonded to the rear carrier. In this case, the light-emitting diode chips are preferably not embedded in individual component housings, but rather are mounted as unhoused chips on the rear carrier.

With the front carrier it is possible, for example, to produce friction-based immobilization of the light-emitting diode chips. An adhesion-promoting material may be arranged in places between the front carrier and the rear carrier, wherein tensile stress between the carriers is achieved. The adhesion promoting material contains, for example, an adhesive designed to shrink on curing and bring about the tensile stress. The light-emitting diode chips are, for example, clamped by the tensile stress between the front and rear carriers such that in particular the front carrier is pressed against the light-emitting diode chips.

The light-emitting diode chips are preferably electrically contacted by the rear and/or of the front carrier. For example, they are soldered or adhesively bonded by an electrically conductive adhesive to an electrical conductor track of the rear carrier.

Alternatively or in addition to rear contacting with a conductor track of the rear carrier, the light-emitting diode chips may each comprise a front contact layer electrically conductively connected to an electrical connection layer of the front carrier. For example, the front contact layers and the electrical connection layer adjoin one another directly, in particular without a solder or adhesive layer arranged therebetween. The front contact layers are in particular light-transmitting and preferably applied over the entire surface of the light-generating semiconductor layer sequence of the respective light-emitting diode chips. The electrical connection layer is preferably light-transmitting at least at those points where it overlaps with the light-emitting diode chips. The contact layers and/or the light-transmitting points of the electrical connection layer of the front carrier may comprise a transparent conductive oxide such as ITO (indium tin oxide) and/or ZnO, in particular ZnO doped with Al and/or Ga.

The rear carrier may comprise at least one conductor track provided for front electrical contacting of at least one of the light-emitting diode chips. In addition, at least one electrical bridge element, for example, a metal block or a silicon block, which is preferably doped such that it is electrically conductive, may be arranged between the front carrier and the rear carrier. The electrical bridge element produces an electrical contact between the conductor track of the rear carrier and the electrical connection layer of the front carrier. The light-emitting diode chips and the at least one electrical bridge element are preferably of roughly the same height. In this way, the bridge element may be immobilized with the carriers in exactly the same way as the light-emitting diode chips. Such electrical bridge elements allow particularly simple production of series circuits, parallel circuits or combinations of series and parallel circuits of the light-emitting diode chips.

The lighting device may comprise a light outcoupling face. The light outcoupling face is designed to couple out light generated by the light-emitting diode chips when the lighting device is in operation. Conveniently, the light outcoupling face is illuminated by the light-emitting diode chips. In particular, it covers the light-emitting diode chips in plan view onto the front of the lighting device.

Preferably, the front carrier comprises the light outcoupling face. Conveniently, the front carrier is in this case light-transmitting, i.e., translucent or transparent, at least in places. The rear carrier may likewise be light-transmitting at least in places.

The light outcoupling face may be designed to release at least some of the waste heat produced by the light-emitting diode chips into the surrounding environment. In particular, the light outcoupling face is an outer face of the lighting device, preferably an outer face of the front carrier remote from the light-emitting diodes. The light outcoupling face preferably adjoins a gaseous medium, in particular air.

When the lighting device is in operation each light-emitting diode chip may be provided for actuation with an electrical nominal power of 100 mW or less. The electrical nominal power of each light-emitting diode chip may amount to 5 mW or more, preferably 20 mW or more and in particular 40 mW or more.

Preferably, the light-emitting diode chips have a light yield of 100 lm/W or more. Light-emitting diode chips with such light yields are known and are, therefore, not explained in any greater detail at this point. An upper light yield limit is physically defined by the maximum possible efficiency and amounts, for example, to 350 lm/W.

The lateral dimensions of the light-emitting diode chips may have a value of 300 µm or less, preferably of 100 µm or less. For example, the light-emitting diode chips are chips which, in plan view onto the front, have a rectangular or square contour with edge lengths of 300 µm or less, preferably of 200 µm or less, for example, of 100 µm or less. The lateral dimensions may have a value of 20 µm or more, in particular of 50 µm or more. With such lateral dimensions, light-emitting diode chips with a power of 100 mW or less are particularly cost-effective to produce.

The lateral dimensions of the light-emitting diode chips are in particular the edge lengths of the light-emitting diode chips. If the light-emitting diode chips, for example, include a light-generating, epitaxial semiconductor layer sequence on a chip carrier substrate, in this con-text in particular the lateral dimensions of the light-generating, epitaxial semiconductor layer sequence are regarded as "lateral dimensions of the light-emitting diode chips." The lateral dimensions of the chip carrier substrate may, for example, to simplify assembly, be noticeably greater than the lateral dimensions of the light-generating, epitaxial semiconductor layer sequence.

The distances between mutually adjacent light-emitting diode chips may be selected to be sufficiently large for the array formed by the light-emitting diode chips to have an electrical power consumption relative to its base, on actuation of the light-emitting diode chips with the electrical nominal power, of less than or equal to 450 W/m², or of less than or equal to 300 W/m² in a further development, when the lighting device is in operation.

The base of the array is here in particular the area of a region of the rear carrier covered by the array, i.e., by the light-emitting diode chips of the array together with the spaces between the light-emitting diode chips, in plan view onto the light outcoupling face. The area of the base of the array corresponds in particular to the area of the light outcoupling face.

Preferably, the distances between mutually adjacent light-emitting diode chips are selected to be sufficiently small for the array formed by the light-emitting diode chips to emit light, in plan view onto the light outcoupling face, with an average luminance of greater than or equal to 2000 Cd/m², or of greater than or equal to 3000 Cd/m² in a further development, on actuation of the light-emitting diode chips with the electrical nominal power when the lighting device is in operation.

The average luminance is in particular the luminance averaged over the base of the array of the light emitted by the light-emitting diode array in plan view onto the light outcoupling face, i.e., in particular in a solid angle of $2\pi$.

In particular, the luminous flux $\Phi$ results from the integral of the light intensity (I) over the solid angle $\Omega$. The consequence is, for example, with isotropic emission in a solid angle of $\Omega=2\pi$, that the average luminance L for an area A of the array has a value of $L=(I)/A=\Phi/(2\pi A)$. If the light-emitting diode chips of the array have a Lambertian emission pattern, for example, because of the cosine-shaped angle dependence of the light intensity I the average luminance on emission in a solid angle of $\Omega=2\pi$ has a value of $L=\Phi/(\pi A)$. The quotient of luminous flux $\Phi$ and area A is here in particular equal to the product of the light yield of the light-emitting diode chips and the power consumption of the light-emitting diode chips relative to the area A.

Alternatively or in addition, the distances between mutually adjacent light-emitting diode chips may be selected to be sufficiently small for the array formed by the light-emitting diode chips to have an electrical power consumption relative to its base, on actuation of the light-emitting diode chips with the electrical nominal power, of greater than or equal to 120 W/m², or of greater than or equal to 200 W/m² when the lighting device is in operation.

The distances between the light-emitting diode chips have a value of less than or equal to 10 mm, for example, in particular of less than or equal to 5 mm, and/or a value of greater than or equal to 0.5 mm, in particular of greater than or equal to 1 mm. They may have a value of 0.5 mm to 5 mm, preferably 1 mm to 4 mm.

When using light-emitting diode chips with such a low electrical nominal power with such lateral spacing, particularly good thermal spread may advantageously be achieved by the rear carrier and/or of the front carrier. In this way, unlike when using light-emitting diode chips with a higher power per light-emitting diode chip with correspondingly larger spacing, the thermal load is particularly uniformly distributed in the lateral direction and the risk of excess heating of the light-emitting diode chips is particularly low.

In particular, the lighting device may be cooled by natural convection via the light outcoupling face without an additional heat sink. For example, with natural convection from the light outcoupling face, a heat output of between 5 W/(m²K) and 10 W/(m²K), for example, of approx. 7 W/(m²K) is released to the air adjoined by the light outcoupling face. Particle transport in the air proceeds in the case of natural convection in particular as a result of the temperature gradient which is brought about by the difference between the temperature of the light outcoupling face and the temperature of the surrounding environment.

In particular, with the lighting device cooled by natural convection without an additional heat sink, when in operation with a power per unit area of 450 W/m² or less the temperature of the light outcoupling face is increased by 65 K or less, preferably by 60 K or less, relative to ambient temperature. In this way, the temperature increase of the light-emitting diode chips may be limited to 70 K or less and in particular to at most 80° C. without an additional heat sink. Thus, the risk of inadequate efficiency of the light-emitting diode chips due to a temperature-dependent drop in efficiency and temperature-dependent shortening of the service life of the light-emitting diodes is advantageously comparatively low.

The distances between mutually adjacent light-emitting diode chips may in each case be less than or equal to 2.5 times, preferably less than or equal to 1.5 times, the distance between the light outcoupling face and the light-emitting diode chips. In this way, particularly uniform luminance distribution may advantageously be achieved for the light outcoupling face.

The distance between mutually adjacent light-emitting diode chips or the distance between the light-emitting diode chips and the light outcoupling face is in the case, for example, of a flexible or curved lighting device, in particular the respective distance in the extended state of the lighting device. If the light outcoupling face comprises patterning, the distance between the light-emitting diode chips and the light outcoupling face is taken to be the distance in particular between the light-emitting diode chips and the light outcoupling face averaged over the area of each light-emitting diode chip and over all the light-emitting diode chips.

The lateral dimensions and/or the electrical nominal powers of the light-emitting diode chips, the distances between mutually adjacent light-emitting diode chips and the distance between the light-emitting diode chips and the light outcoupling face may be adapted to one another such that, when the lighting device is in operation, the waste heat generated by the light-emitting diode chips raises the temperature of the light outcoupling face by 7 K or more relative to ambient temperature. For example, the temperature of the light outcoupling face is raised to 7 K to 65 K, in particular 7 K to 60 K, preferably 10 K to 50 K relative to ambient temperature, the limit values in each case being included. In the case of a rise in the temperature of the light outcoupling face of 7 K or more, cooling of the lighting device via the light outcoupling face by natural convection may proceed particularly effectively, in particular owing to the magnitude of the temperature gradient caused.

The lateral dimensions and/or the electrical nominal powers of the light-emitting diode chips, the distances between mutually adjacent light-emitting diode chips and the distance between the light-emitting diode chips and the light outcoupling face may additionally or alternatively be adapted to one another such that, when the lighting device is in operation, the waste heat generated by the light-emitting diode chips raises the temperature of the light-emitting diode chips by 70 K or less, preferably by 60 K or less, relative to ambient temperature. In particular, adaptation proceeds here in that the waste heat increases the temperature of the light-emitting diode chips at an ambient temperature of 25° C. or less, for example, at an ambient temperature of 15° C. to 25° C., to at most 80° C., preferably to at most 60° C.

The temperature of the light-emitting diode chips or the temperature of the light outcoupling face in particular denotes the temperature in continuous operation of the lighting device on actuation of the light-emitting diode chips with their electrical nominal power. Preferably, the respective temperature is averaged over the front surface of the respective light-emitting diode chips or over the light outcoupling face. Ambient temperature is understood in particular to be the temperature of the medium adjoining the light outcoupling face without the waste heat introduced by the light-emitting diodes, i.e., when the lighting device is switched off or at a significant distance from the lighting device. Ambient temperature is, for example, room temperature.

The lighting device may additionally be designed for cooling by heat emission at a rear outer face, i.e., remote from the light-emitting diode chips, of the rear carrier. In a similar manner in particular to the light outcoupling face of the front carrier, the rear outer face of the rear carrier constitutes an outer face of the lighting device which, for example, adjoins a gaseous medium such as air.

The distance between the light outcoupling face and the light-emitting diode chips may be less than or equal to 5 mm, preferably less than or equal to 4 mm. In this way, a particularly low structural height may be achieved for the lighting device, wherein due to the small dimensions of and distances between the light-emitting diode chips, at the same time sufficiently uniform luminance distribution of the light emitted by the lighting device may be achieved over the light outcoupling face.

The lighting device is preferably free of a metallic heat sink, in particular of a metallic heat sink comprising cooling ribs. For example, the regions of the front or rear carrier which respectively include the rear outer face provided for heat release or the light outcoupling face are formed of a vitreous material and/or a plastics material. In this way, lighting devices are advantageously achievable which are of particularly low structural height. In one configuration, for example, the lighting device is of a structural height of less than or equal to 10 mm, in particular of less than or equal to 5 mm. In addition, the lighting device may be produced particularly cost-effectively and may be of flexible construction.

The light-emitting diode chips of a height, i.e., an extent from the front to the rear, of 15 µm or less, preferably of 10 µm or less, for example, of 5 µm or less. The height is in particular 2 µm or greater, for example, 3 µm or greater The light-emitting diode chips may be substrateless light-emitting diode chips. "Substrateless light-emitting diode chips" are in particular light-emitting diode chips which comprise a light-emitting, epitaxial semiconductor layer sequence which has been detached from its growth substrate. The epitaxial semiconductor layer sequence of a substrateless light-emitting diode chip is preferably also not attached to a chip carrier substrate other than the growth substrate, and other than the front and rear carriers of the lighting device. A substrateless light-emitting diode chip consists, for example, of the epitaxial semiconductor layer sequence provided on the front and/or the rear with a contact layer for n-side contacting and/or a contact layer for p-side contacting. The contact layers contain, for example, a metal, for instance Ag and/or Au, and/or a transparent conductive oxide (TCO) such as ITO and/or ZnO.

Dissipation of the waste heat, in particular to the rear carrier, is particularly efficient with light-emitting diode chips of such low heights such as for instance substrateless light-emitting diode chips such that the waste heat generated by the light-emitting diode chips when in operation advantageously increases the temperature thereof to a particularly small degree.

A refractive index matching material, for instance a silicone-based fluid, may be arranged between the light-emitting diode chips and the front carrier. For example, the refractive index of the refractive index matching material differs by 1 or less from the refractive index of the material of the respective light-emitting diode chip which adjoins the refractive index matching material, and the refractive index of the refractive index matching material differs by 1 or less from the refractive index of the material of the front carrier which adjoins the refractive index matching material. The refractive index of the refractive index matching material preferably lies between the refractive index of the material which it adjoins at the front and the refractive index of the material which it adjoins at the rear.

A major face, facing the front carrier, of each light-emitting diode chip may comprise a trough-like recess filled with the refractive index matching material. For example, the front contact layer of the light-emitting diode chip is constructed as a frame to form the trough-like recess. In this case, in plan view onto the front the contact layer in particular covers a circumferential edge region of the semiconductor layer sequence of the light-emitting diode chip and leaves free a central region of the semiconductor layer sequence enclosed by the edge region. The refractive index matching material is arranged in particular in the central region. Such a configuration may, for example, be advantageous if the semiconductor layer sequence of the light-emitting diode chips is roughened on the front to improve light outcoupling.

The front carrier may enclose a plurality of mutually separate cavities, each cavity overlapping with one of the light-emitting diode chips. Each cavity is in particular filled partially or completely with a luminescence conversion element, which contains a luminescent material. The cavities are preferably completely enclosed by a main body, in particular a light-transmitting main body, of the front carrier. The main body may be of multipart construction. For example, it comprises a first part with recesses, which are covered by a second part to form the cavities.

Preferably, in plan view onto the front of the lighting device each cavity completely covers precisely one light-emitting diode chip and is spaced laterally from the other light-emitting diode chips. The lateral dimensions of the cavities are preferably less than or equal to 3 times, in particular less than or equal to twice, the corresponding lateral dimension of the light-emitting diode chip with which the respective cavity overlaps. In this way, a lighting device may be achieved which does not exhibit the color of the luminescent material when switched off, something which may be perceived by the observer as troublesome.

A first sub-region of each cavity facing the respective light-emitting diode chip may contain the luminescence conversion element and a second sub-region of the cavity remote from the respective light-emitting diode chip may be filled with a material, in particular a gas such as air, which has a lower refractive index than the material of the front carrier, which delimits the cavity towards the light outcoupling face. The second sub-region may comprise a curved surface. With the second sub-region, particularly good light mixing may be achieved in the front carrier such that, in particular with a small structural height of the lighting device, particularly good uniformity of luminance distribution may be achieved for the light outcoupling face.

The front carrier may include a light-diffusing and/or diffusely reflecting layer. For light diffusion and/or diffuse reflection, the light-diffusing and/or diffusely reflective layer in particular contains scattering particles preferably embedded in a matrix material, for instance a silicone-based matrix material. The light-diffusing and/or diffusely reflecting layer may enclose the luminescence conversion element laterally. In particular, the side walls of the cavities in the front carrier are formed by the light-diffusing and/or diffusely reflecting layer.

A lighting device is provided which may comprise a front carrier, a rear carrier and a plurality of light-emitting diode chips, which emit light and release waste heat when the lighting device is in operation, wherein the rear carrier is covered at least in places by the front carrier and the light-emitting diode chips are arranged between the rear carrier and the front carrier so they form an array. The light-emitting diodes are contacted electrically by the rear and/or of the front carrier and immobilized mechanically by the rear carrier and the front carrier. The front carrier is coupled thermally conductively to the light-emitting diode chips and comprises a light outcoupling face remote from the light-emitting diode chips, which light outcoupling face is designed to release some of the waste heat released by the light-emitting diode chips into the surrounding environment.

Each light-emitting diode chip is provided for actuation with an electrical nominal power of 100 mW or less when the lighting device is in operation and has a light yield of 100 lm/W. The distances between mutually adjacent light-emitting diode chips are selected to be sufficiently large for the array formed by the light-emitting diode chips to have an electrical power consumption relative to its base, on actuation of the light-emitting diode chips with the electrical nominal power, of less than or equal to 450 W/m$^2$, when the lighting device is in operation. The distances between mutually adjacent light-emitting diode chips are selected to be sufficiently small for the array formed by the light-emitting diode chips to emit light, in plan view onto the light outcoupling face, with an average luminance of greater than or equal to 2000 Cd/m$^2$, on actuation of the light-emitting diode chips with the electrical nominal power when the lighting device is in operation. In addition, the distances are less than or equal to 2.5 times the distance between the light outcoupling face and the light-emitting diode chips.

The distances between the light-emitting diode chips may have a value of less than or equal to 10 mm, for example, less than or equal to 5 mm, for example, they have a value of 0.5 mm to 5 mm, preferably 1 mm to 4 mm. The distance between the light-emitting diode chips and the light outcoupling face has, for example, a value of 3 mm to 5 mm, for example, it has a value of 4 mm. The electrical nominal power of each light-emitting diode chip may have a value greater than or equal to 2 mW, in particular a value of 20 mW to 60 mW.

In this way, a lighting device of low structural height may advantageously be achieved, which can be cooled by natural convection without a metallic heat sink.

A lighting device is provided which may comprise a front carrier, a rear carrier and a plurality of light-emitting diode chips designed to emit light and waste heat, the rear carrier being covered at least in places by the front carrier, the light-emitting diode chips being arranged between the rear carrier and the front carrier and immobilized mechanically thereby and being contacted electrically by the rear and/or of the front carrier, the front carrier comprising a light out-coupling face remote from the light-emitting diode chips, which light outcoupling face releases some of the waste heat generated by the light-emitting diode chips to the surrounding environment, and the lateral dimensions of the light-emitting diode chips, the distances between mutually adjacent light-emitting diode chips and the distance between the light-emitting diode chips and the light outcoupling face being adapted to one another such that, when the lighting device is in operation, the waste heat generated by the light-emitting diode chips raises the temperature of the light-emitting diode chips by 70 K or less relative to ambient temperature and raises the temperature of the light outcoupling face by 7 K or more relative to ambient temperature.

In this way, a lighting device of low structural height may likewise advantageously be achieved, which can be cooled by natural convection without a metallic heat sink.

The lateral dimensions of the light-emitting diode chips, the distances between mutually adjacent light-emitting diode chips and the distance between the light-emitting diode chips and the light outcoupling face may be adapted to one another such that, when the lighting device is in operation, the waste heat generated by the light-emitting diode chips raises the temperature of the light-emitting diode chips by 70 K or less relative to ambient temperature and raises the temperature of the light outcoupling face by 7K or more relative to ambient temperature, the lateral dimensions of the light-emitting diode chips being selected to be less than or equal to 300 μm, in particular less than or equal to 100 μm, the distances between the light-emitting diode chips being selected to be less than or equal to 10 mm, in particular less than or equal to 5 mm, for example, 0.5 mm to 5 mm, preferably 1 mm to 4 mm and the distance between the light-emitting diode chips and the light outcoupling face being selected to be 3 mm to 5 mm, for example, equal to 4 mm. The electrical nominal power of each light-emitting diode chip may have a value of 2 mW to 100 mW, in particular 20 mW to 60 mW.

Further advantages and advantageous configurations of our lighting device are revealed by the following examples described in association with the Figures.

In the examples and figures, identical or identically acting components are provided with the same reference numerals. The size ratios relative to one another of the figures and the elements illustrated in the figures should not be regarded as true to scale, unless units are explicitly stated. Instead, individual elements are shown exaggeratedly large and/or thick to improve depiction and/or comprehension.

FIG. 1 shows a schematic cross-section through a portion of a lighting device according to a first example.

The lighting device according to the first example comprises a front carrier 1 and a rear carrier 2. In plan view onto the front of the lighting device, the rear carrier 2 is completely covered by the front carrier 1. In particular, the two carriers 1, 2 are laterally flush with one another and have, for example, a square base with an edge length of 30 cm.

Recesses in the front carrier 1 accommodate light-emitting diode chips 3, which are provided to emit light and when in operation release waste heat in addition to light. The light-emitting diode chips 3 are arranged between the front carrier 1 and the rear carrier 2 such that they form an array. For example, they are arranged at the grid points of an imaginary regular and in particular rectangular or square grid.

Figure 2:
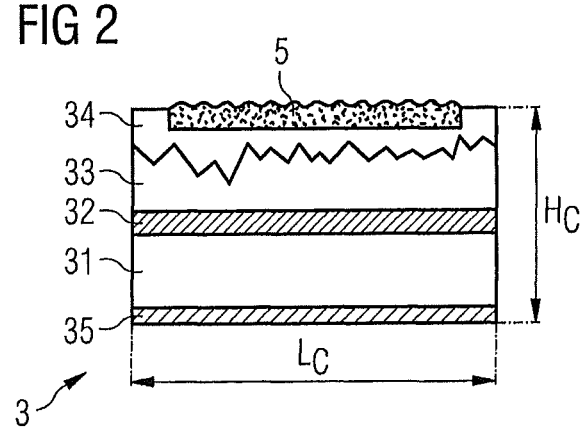
FIG. 2 shows a schematic cross-section through a light-emitting diode chip of the lighting device of the example of FIG. 1.

FIG. 2 shows a schematic cross-section through a light-emitting diode chip of the lighting device of the example of FIG. 1.

The light-emitting diode chips 3 are substrateless light-emitting diode chips, which each consist of an epitaxial semiconductor layer sequence 31, 32, 33 and two contact layers

34, 35. The height $H_C$ of the light-emitting diode chips has in particular a value of 3 µm to 15 µm, preferably 3 µm to 10 µm, for example, 5 µm to 10 µm, the limit values in each case being included. For example, when the lighting device is in operation, the light-emitting diode chips 3 are provided for actuation with a nominal power which has a value of 0.5 mW to 10 mW, for example, are provided for actuation with a nominal power of approx 2 mW. The light yield of the light-emitting diode chips 3 amounts to 115 lm/W. The lateral dimensions $L_C$ of the light-emitting diode chips 3, in this case square in plan view, amount here to approx. 200 µm.

The epitaxial semiconductor layer sequence comprises one layer of a first conductivity type and one layer of a second conductivity type, for example, a p-conductive layer 31 and an n-conductive layer 33, between which there is arranged an active layer 32 to generate light. It is also feasible for the n-side and the p-side of the light-emitting diode chips 3 to be arranged in a reverse sequence. The active layer in particular contains a pn-junction, a double heterostructure, a single quantum well structure or a multiple quantum well structure for generating light. The semiconductor layer sequence 31, 32, 33 is based, for example, on a III-V compound semiconductor material such as AlInGaN or InGaAlP.

A first contact layer 34 is applied to the front surface, remote from the active layer 32, of the n-conducting layer 33, which in this case has been roughened to improve light outcoupling. The first contact layer 34 consists of ITO and/or ZnO, in particular of ZnO doped with Al and/or Ga, i.e., ZnO:(Al,Ga). The front surface of the light-emitting diode chips 3 preferably does not comprise a metal layer such as a bond pad. In this way, a particularly large proportion of the light emitted by the active layer 32 towards the front may be emitted through the front surface of the light-emitting diode chip. Bond pads generally have dimensions of at least 80 µm×80 µm to ensure reliable attachment of a bonding wire and, in the case of light-emitting diode chips 3 with dimensions as in this example, would therefore cover a large part of the front surface of the light-emitting diode chip.

A second contact layer 35 is applied to the rear surface, remote from the active layer 32, of the p-conducting layer 31, which second contact layer consists, for example, of at least one metal such as Ag and/or Au.

The front carrier 1 comprises a light outcoupling face 101, through which the light emitted by the light-emitting diode chips 3 when the lighting device is in operation is coupled out. Conveniently, the front carrier 1 consists of a light-transmitting material such as glass or plastics, for example, polymethyl methacrylate (PMMA), polycarbonate (PC) or polyethylene terephthalate (PET).

The rear carrier 2 is in this case reflective and electrically conductive. For example, it contains a metal at least on its front. Alternatively, the rear carrier 2 may also be designed to be light-transmitting at least in places. This makes it possible to achieve a light-transmitting, i.e., translucent or transparent lighting device, for example.

On a front bottom face of each recess, the front carrier 1 comprises a light-transmitting electrical connection layer 10, which comprises, for example, a transparent conductive oxide such as ITO or ZnO:(Al,Ga) and/or a conductive polymer such as PEDOT:PSS or consists of at least one of these materials. The electrical connection layer 10 in places directly adjoins the semiconductor chip 3 accommodated in the respective recess. In particular, the electrical connection layer 10 and the first contact layer 34 are in places in mutual contact.

At other points the electrical connection layer 10 and the first contact layer 34 are spaced from one another in the lighting device according to this example. The resultant space is filled completely, for example, with a refractive index matching material, for example, a silicone-based "index matching gel." In particular, the first contact layer 34 forms a frame on an edge region of the n-conducting layer 33, which leaves free a central region of the n-conducting layer 33. The central region is covered by the index matching gel.

The front carrier 1 is attached to the rear carrier, for example, by a layer of adhesive 4. In plan view onto the front and the rear opposite the front of the lighting device, the light-emitting diode chips 3 are preferably not covered by the adhesive 4.

The adhesive layer 4, for example, brings about a tensile stress between the front carrier 1 and the rear carrier 2. With the tensile stress, the light-emitting diode chips 3 may be pressed onto the front carrier 1 and onto the rear carrier 2. In this way, stable mechanical and electrical contact between the electrical connection layer 10 of the front carrier 1 and the first contact layers 34 of the light-emitting diode chips 3 is in particular achieved.

Stable mechanical and electrical contact between the rear carrier 2 and the second contact layer 35 may likewise be achieved by the tensile stress. Alternatively or in addition, the light-emitting diode chips 3 may be attached to and electrically contacted with the rear carrier 2 by a conductive adhesive or a soldering metal.

The lateral dimension $L_C$ of the light-emitting diode chips 3, the distance $d_C$ between adjacent light-emitting diode chips 3 and the distance $d_L$ between the light-emitting diode chips 3 and the light outcoupling face 101 are adapted to one another such that, when the lighting device is in operation, the waste heat released by the light-emitting diode chips 3 on actuation with the nominal power is released by natural convection at the light outcoupling face 101 and a rear outer face 201 of the rear carrier 201 opposite the light outcoupling face 101, the waste heat generated by the light-emitting diode chips 3 raising the temperature of the light-emitting diode chips 3 by 60 K or less relative to ambient temperature and raising the temperature of the light outcoupling face 101 by 7K or more relative to ambient temperature.

The light outcoupling face 101 and the rear outer face 201 in particular constitute outer faces of the lighting device, which adjoin air, for example. The thermal output released by natural convection at the light outcoupling face 101 or the rear outer face 201 amounts, for example, to approx. 7 W per square meter and per Kelvin temperature difference between ambient temperature and the temperature of the light outcoupling face 101 or the rear outer face 201. Ambient temperature is the temperature of the air before start-up of the lighting device or at a significant distance from the lighting device.

In this case, the distance $d_L$ between the light-emitting diode chips 3 and the light outcoupling face 101 the lighting device amounts to 4 mm. The structural height $H_B$ of the lighting device amounts, for example, to 4.5 mm.

The distance $d_C$ between mutually directly adjacent light-emitting diode chips amounts here to approx. 4 mm such that, for example, the light-emitting diodes 3 form an array with 75×75 light-emitting diodes and a total nominal power of approx. 10 W. The temperature increase experienced by the light outcoupling face 101 relative to ambient temperature amounts in this case to approx. 10 K. The temperature of the light-emitting diode chips 3 is raised, for example, by less than 20 K relative to ambient temperature.

In this example the distance $d_C$ between mutually directly adjacent light-emitting diode chips 3 is, at 4 mm, of roughly exactly the same magnitude as the distance $d_L$ between the light-emitting diode chips 3 and the light outcoupling face 101 of the lighting device. The electrical power consumption of the array formed of 75×75 light-emitting diodes 3 with a nominal power each of 2 mW amounts to approx. 125 W/m², relative to its base of 30 cm×30 cm.

For the array according to this example, which illuminates a solid angle of 2π with an efficiency of approx. Φ/P=115 lm/W at a power consumption of P/A=125 W/m², the light-emitting diode chips 3 exhibiting a Lambertian emission pattern, the average luminance L amounts to approx. L=(Φ/P*P/A)/π≈4500 Cd/m². In the case of light-emitting diode chips with isotropic emission, the average luminance would have a value of approx 2000 Cd/m².

Figure 3:
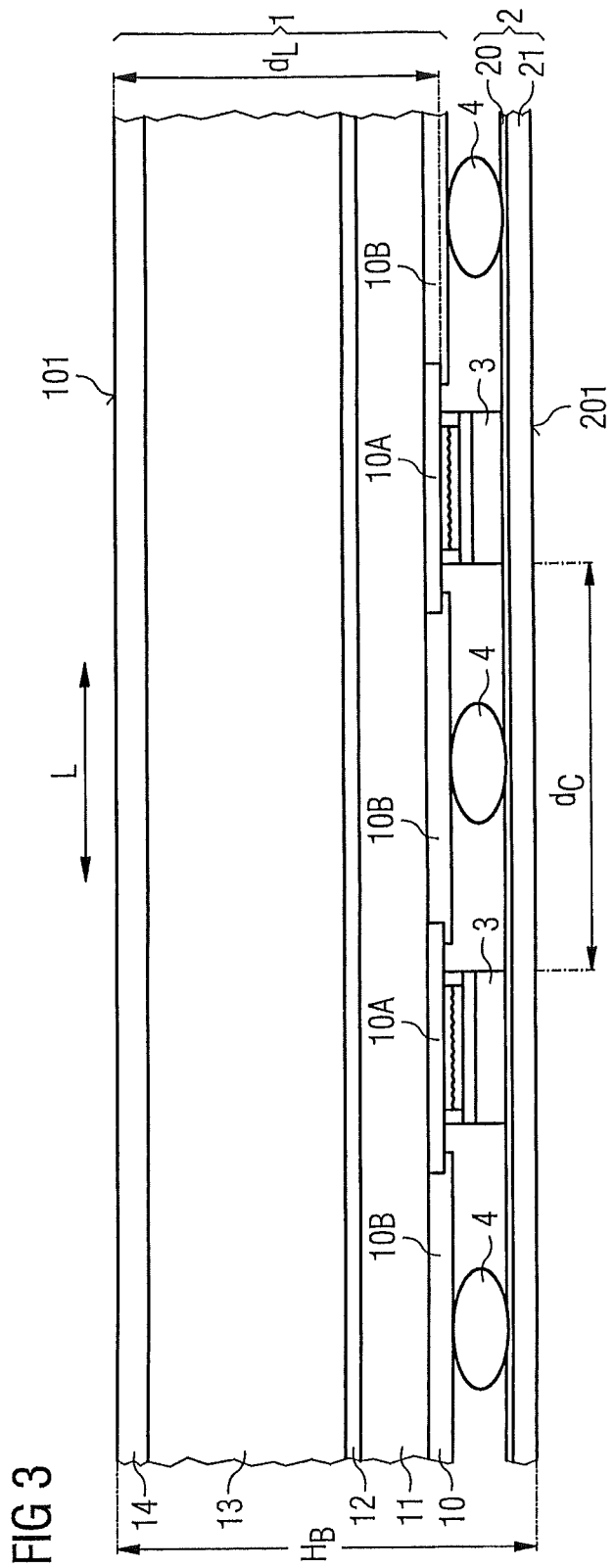
FIG. 3 shows a schematic cross-section through a portion of a lighting device according to a second example.

FIG. 3 shows a schematic cross-section through a portion of a lighting device according to a second example.

In the second example, unlike in the first example, the front carrier 1 and the rear carrier are not adhesively bonded over the entire surface apart from the light-emitting diode chips 3. Instead, dots 4 or lines 4 of adhesive spaced from one another and from the light-emitting diode chips 3 are arranged between the light-emitting diode chips 3.

Dots of adhesive are in particular adhesive droplets, preferably extending by a comparatively small amount in all lateral directions. Lines of adhesive, also known as adhesive beads extend substantially in one lateral direction and extend only slightly in the lateral direction perpendicular thereto.

As in the first example, an adhesive 4 is used, which shrinks on curing such that the volume of the dots or lines 4 of adhesive reduces on curing of the adhesive during production of the lighting device, which in particular includes a lamination process. In this way, a tensile stress is achieved between the front carrier 1 and the rear carrier 2.

Unlike in the first example, the light-emitting diode chips 3 are not accommodated in recesses in the front carrier 1. Instead, the front and rear carriers 1, 2 are each substantially plane-parallel sheets.

The front carrier 1 is pressed against the light-emitting diode chips 3 by the tensile stress generated by the dots or lines 4 of adhesive such that friction-based immobilization of the light-emitting diode chips 3 with the front carrier 1 is obtained. The light-emitting diode chips 3 are here soldered to the rear carrier or adhesively bonded thereto by an electrically conductive adhesive. The solder or adhesive layer between the light-emitting diode chips 3 and the rear carrier 2 is omitted in the figures to simplify representation.

The front carrier comprises a main body 11, 12, 13, an electrical connection layer 10 facing the light-emitting diode chips 3 and an outcoupling layer 14. The outcoupling layer 14 contains the light outcoupling face 101 and delimits the front carrier 1, and thus in particular the lighting device, towards the front of the lighting device. The electrical connection layer delimits the front carrier 1 towards the light-emitting diode chips 3.

The electrical connection layer 10 comprises first parts 10A, which, like the electrical connection layer of the first example, are of light-transmitting construction and contain ITO, ZnO:(Al,Ga) or PEDOT:PSS, for example. In plan view onto the front of the lighting device, the first parts 10A each overlap with one of the light-emitting diode chips 3. In places they adjoin the first contact layer 34 of the respective light-emitting diode chips 3, while in other places a space between the first contact layer 34 and the respective first part 10A is completely filled with a refractive index matching material, for example, a silicone-based "index matching gel," as described in connection with the first example.

In this example the electrical connection layer 10 of the front carrier 1 additionally includes at least one second part 10B which, for example, connects at least two of the first parts 10A together electrically conductively. For example, the second part 10B overlaps with an edge region of the respective first part 10A. The at least one second part 10B in particular constitutes a current distribution layer.

The at least one second part 10B may alternatively or additionally constitute an electrically conductive reflector layer 10B. For example, it contains a metal with high reflectivity, for instance Ag. In one configuration, in plan view onto the front carrier 1 the second part(s) 10B cover(s) at least 50%, preferably at least 70%, particularly preferably at least 85% of the light outcoupling face 101.

In another configuration the electrical connection layer 10 is applied over the entire surface of the main body 11, 12, 13. In yet another configuration it is patterned for serial and/or parallel electrical interconnection of the light-emitting diode chips 3. The electrical connection layer 10, for example, has a height of, i.e., extends from the front to the rear by, 20 μm to 200 μm, for example, 50 μm to 150 μm. For example, it has a height of approx. 100 μm. It is also feasible for the electrical connection layer 10 to exhibit a height of less than 20 μm. Such small thicknesses may be advantageous, for example, if the lighting device is of flexible and/or light-transmitting construction.

The main body comprises or consists of a carrier element 11, a bonding layer 12 and a light mixing element 13. The main body 11, 12, 13 of the front carrier 1 is of light-transmitting construction, in particular the main body consists of materials which transmit the light emitted by the light-emitting diode chips 3. For example, the carrier element 11 of the front carrier 1 is formed of a plastics sheet or film which comprises or consists of polyethylene terephthalate (PET), for example. In one configuration, the bonding layer 12 contains an adhesive which contains a silicone material, or consists thereof. The light mixing element 13 contains, for example, glass, which in one configuration contains $SiO_2$, and/or PMMA or consists of at least one of these materials.

The carrier element 11 faces the light-emitting diode chips 3. In this case, the electrical connection layer 10 is formed directly on the carrier element 11. The carrier element 11 has a height of, for example, 50 μm to 500 μm, preferably 100 μm to 200 μm.

The light mixing element 13 is attached to the carrier element on the side remote from the light-emitting diode chips 3 by the bonding layer 12. The light mixing element 13 is in particular designed to deflect some of the light emitted by the light-emitting diode chips towards the light outcoupling face 101, for example, by total reflection and/or diffusion. In this way, the light coupled out from the lighting device at one point on the light outcoupling face 101 originates from a plurality of, for example, three or more, in particular five or more, light-emitting diodes 3. Particularly uniform luminance distribution of the light emitted by the light outcoupling face 101 may thus be achieved. The light mixing element may have a height of 2 mm to 6 mm, preferably 3 mm to 5 mm, the limit values in each case being included. In this case it has a height of 4 mm.

The outcoupling layer 14 may, for example, be formed of a front edge region of the light mixing element 13. In this case, however, it is applied onto the light mixing element 13 as a separate layer. The front outer face of the outcoupling layer 14 is formed in particular of the light outcoupling face 101. The outcoupling layer 14 is conveniently provided with pattern units which are designed to improve light outcoupling relative to the outcoupling from a planar surface. The pattern units, for example, comprise raised portions of and/or recesses in the light outcoupling face 101. Such patterning is known. The pattern units may have dimensions of an order of magnitude of one or more wavelengths of the light emitted by the light-emitting diode chips 3, for example, 50 nm to 5 μm, in particular 100 nm to 1 μm.

In this case, the rear carrier 2 comprises a conductor track 20 adjacent the light-emitting diode chips 3 and a carrier element 21. The conductor track 20 may be patterned for serial and/or parallel interconnection of the light-emitting diode chips 3. In particular, the rear carrier constitutes a circuit board, for example, a printed circuit board (PCB). The rear carrier has a height of 50 μm to 200 μm, for example. It may have a height of approx. 100 μm. The conductor track has a height of 5 μm to 20 μm, for example, in particular of 10 μm to 15 μm. Conductor tracks of lower heights are also conceivable and may be advantageous if the lighting device is of flexible and/or light-transmitting construction.

Overall, the lighting device preferably has a structural height $H_B$ of 3 mm to 10 mm, preferably 4 mm to 6 mm. In this case, the structural height $H_B$ of the lighting device has a value of approx. 4.5 mm.

Like the carrier element 11 of the front carrier 1, the carrier element 21 of the rear carrier 2 in this case comprises a plastics material such as PET or consists thereof. Alternatively, the carrier element 21 of the rear carrier 2 may, for example, comprise or consist of a stainless steel foil, for instance of stainless steel of the V2A type. If the carrier element 21 of the rear carrier 2 is electrically conductive, the latter conveniently comprises an electrical insulation layer between the carrier element 21 and the conductor track 20. In the case of parallel connection of the light-emitting diode chips 3, the insulation layer may be omitted. A further insulation layer may be applied to the rear of the electrically conductive carrier element 21.

The lighting device according to the second example, for example, contains 225 light-emitting diode chips 3 in plan view onto the front, at the grid points of an imaginary square grid. In this case, all the light-emitting diode chips 3 are energized in parallel.

The light-emitting diode chips 3 are configured similar to the light-emitting diode chips described in relation to FIG. 2. In particular, they have, for example, a square base with an edge length $L_C$ of approx. 200 μm and a height HC of 5 μm to 15 μm.

The nominal power of the light-emitting diode chips amounts in this case to approx. 45 mW. The lighting device is thus intended to operate with a power consumption of 10 W. For example, when the lighting device is in operation a luminous flux of 1000 μm is emitted from the light outcoupling face 101. In other words, the light-emitting diode chips 3 have a light yield of 100 μm/W.

Some of the waste heat is released by the lighting device at the light outcoupling face 101 into the surrounding environment, in particular to the air surrounding the lighting device. A further part of the waste heat emitted by the light-emitting diode chips 3 when in operation is dissipated from the lighting device by a rear outer face 201 of the substantially planar rear carrier 2. Preferably, dissipation of the waste heat at the light outcoupling face 101 and at the rear outer face 201 involves heat release by natural convection.

Thermal spread is achieved, for example, by the conductor track 20 or by the conductor track 20 and the carrier element 21. The small lateral dimensions $L_C$ of the light-emitting diode chips 3 contribute to the fact that comparatively little waste heat is released per light-emitting diode chip 3 and thus a particularly uniform lateral distribution of the heat sources formed by the light-emitting diode chips may be achieved. In this way, the waste heat may be dissipated particularly well by the individual light-emitting diode chips 3 and distributed particularly uniformly over the light outcoupling face 101 and the rear outer face 201 of the rear carrier 2.

Figure 9:
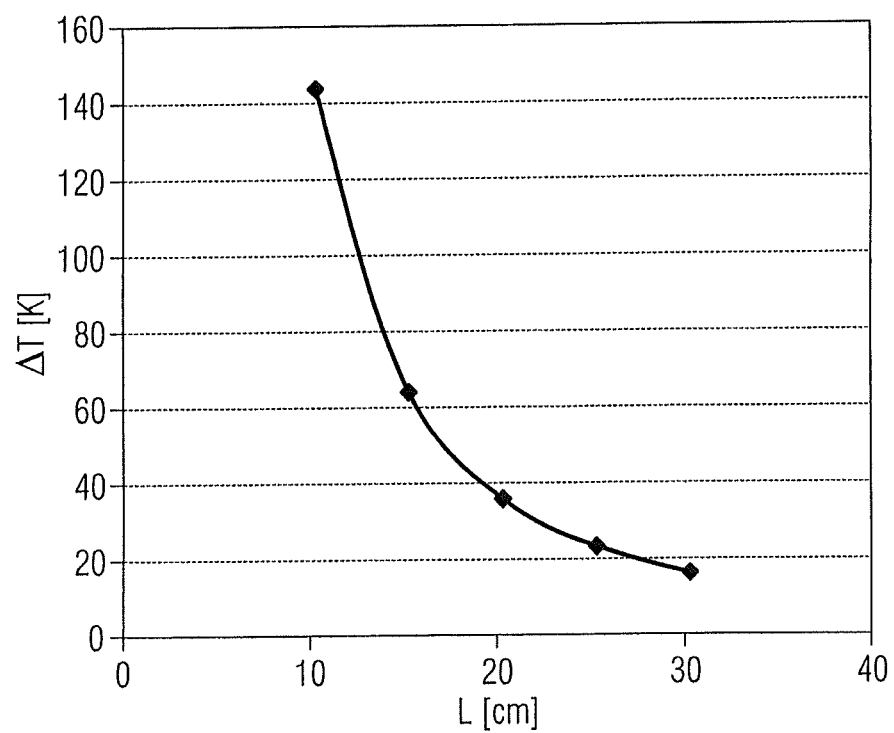
FIG. 9 shows a diagram of the temperature increase experienced by the light outcoupling face as a function of the edge length of the lighting device in the second example.

FIG. 9 shows a diagram of the temperature increase ΔT of the light outcoupling face 101 in Kelvin as a function of its edge length L for the lighting device according to the second example. In FIG. 3, which shows a portion of the lighting device, the direction of the edge length L of the light outcoupling face 101 is indicated by an arrow.

The temperature increase ΔT was calculated for release of a thermal output of 7 W/(m²K) by natural convection at the boundary surface between the light outcoupling face 101 and the surrounding air in the case of a light outcoupling face 101 with square contour as a function of the edge length L of the light outcoupling face 101. Cooling of the lighting device via the rear outer face 201 of the rear carrier 2 is negligible in this case.

With an edge length L of 15 cm, corresponding to a distance $d_C$ between adjacent light-emitting diode chips 3 of 10 mm, the temperature increase ΔT of the light outcoupling face 101 relative to ambient temperature has a value of 63.5 K, i.e., of less than 65 K and of more than 7 K.

With a smaller edge length L than 15 cm the temperature increase ΔT of the light outcoupling face 101 and thus also of the light-emitting diode chips 3 relative to ambient temperature is greater such that the risk of a reduction in the service life and efficiency of the light-emitting diode chips 3 is increased. With greater edge lengths L the temperature increase ΔT drops, for example, to a value of approx. 36 K for an edge length L of 20 cm, approx. 23 K for an edge length L of 25 cm and approx. 16 K for an edge length L of 30 cm.

With an edge length L of the light outcoupling face of 15 cm, which corresponds to the edge length of the array of light-emitting diodes 3, the area-averaged electrical power consumption per unit area for the lighting device according to this example amounts to 445 W/m², making it less than 450 W/m². The average luminance amounts in this case, in plan view onto the light outcoupling face, on the basis of an illuminated solid angle of 2π, and with an efficiency of 100 lm/W, to approx. 14000 Cd/m² with a Lambertian emission pattern of the light-emitting diode chips 3 and approx. 7000 Cd/m² with an isotropic emission pattern of the light-emitting diode chips 3. It is consequently greater than 2000 Cd/m².

The distance $d_L$ between the light outcoupling face 101 and the light-emitting diode chips 3 amounts, for example, to approx. 4.3 mm in the lighting device according to the second example. The distance $d_C$ between adjacent light-emitting diode chips 3 of 10 mm for an edge length L of the square light outcoupling face 101 of 15 cm is thus less than 2.5 times the distance $d_L$. With an edge length L of the light outcoupling face of, for example, over 25 cm and the same number of light-emitting diode chips 3, the corresponding distance $d_C$ increases to over 2.5 times the distance $d_L$. With larger edge lengths L than 25 cm, the risk of inadequate uniformity of the light emitted by the light outcoupling face 101 may arise.

Figure 4:
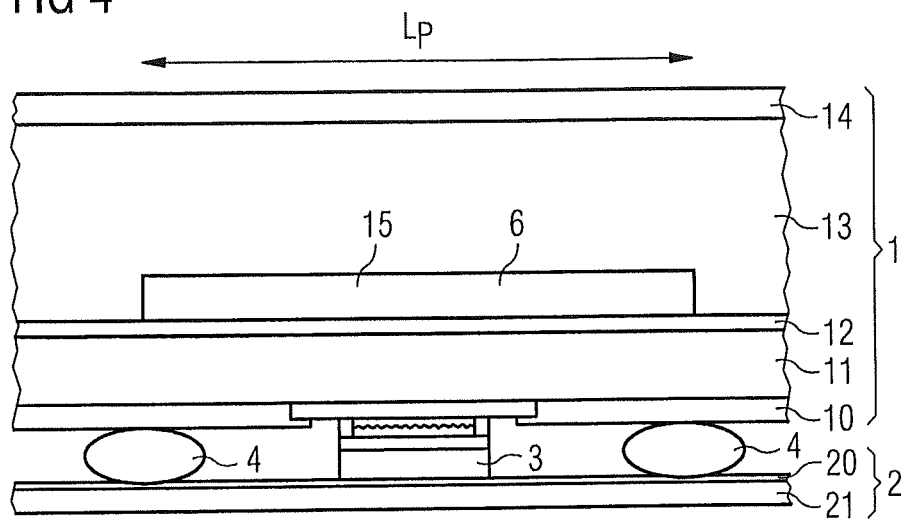
FIG. 4 shows a schematic cross-section through a portion of a lighting device according to a third example.

FIG. 4 shows a schematic cross-section through a portion of a lighting device according to a third example.

The lighting device of the third example corresponds substantially to that of the second example. However, it additionally comprises a plurality of luminescence conversion elements 6. The luminescence conversion elements contain a, preferably inorganic, luminescent material such as, for example, YAG:Ce. The luminescent material converts light emitted by the light-emitting diode chips 3 (primary light), for example, blue primary light into secondary light of another wavelength, for example, a wavelength from the green, yellow or red spectral range. The luminescence conversion elements 6 may transmit some of the primary light such that the lighting device emits mixed light consisting of primary light from the light-emitting diode chips 3 and secondary light from the luminescence conversion elements 6. Alternatively, the conversion elements absorb the primary light completely or virtually completely such that the lighting device in particular emits light with the emission spectrum of the secondary light emitted by the luminescent material.

The individual luminescence conversion elements are arranged in cavities 15 spaced laterally from one another in the front carrier 1. If light-emitting diode chips 3 were used instead which themselves contain the luminescence conversion elements, the luminescence conversion elements included in the light-emitting diode chips 3 would, in this lighting device, be arranged, for example, to the rear of the electrical connection layer 10. Such an arrangement would be less suitable in the lighting device according to this example because of the particular manner of chip mounting and chip contacting between the front and rear carriers 1, 2.

The light mixing element 13 comprises recesses in its rear surface, for example, which are completely filled with a potting compound containing the luminescent material to form the luminescence conversion elements 6. The recesses are, for example, filled by a knife coating process during production of the front carrier 1.

Each luminescence conversion element 6 is associated with one of the light-emitting diode chips 3 and overlaps with the respective light-emitting diode chip 3 in plan view onto the front of the lighting device. In particular, it covers the light-emitting diode chip completely, i.e., the lateral dimensions $L_p$ of the respective luminescence conversion element 6 are greater than or equal to the lateral dimensions $L_C$ of the light-emitting diode chip 3. Preferably, the lateral dimensions $L_p$ of the luminescence conversion element 6 are two to three times as great as the lateral dimensions $L_C$ of the light-emitting diode chips 3, the limit values being included.

Figure 5:
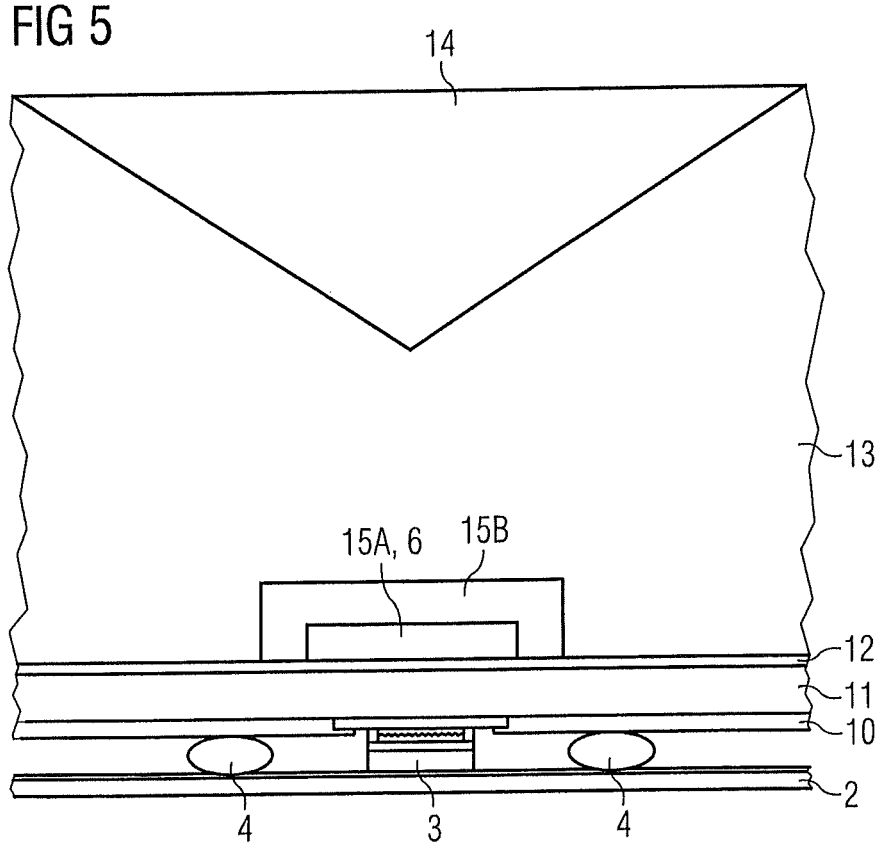
FIG. 5 shows a schematic cross-section through a portion of a lighting device according to a fourth example.

FIG. 5 shows a schematic cross-section through a portion of a lighting device according to a fourth example.

This differs from the third example in that the cavities 15 each comprise a first sub-region 15A, which contains the luminescence conversion element 6, and a second sub-region 15B, which does not contain the luminescence conversion element 6 and follows the first sub-region 15A at least in the direction of the light outcoupling face 101.

The first sub-region 15A and the luminescence conversion element 6 cover the light-emitting diode chip completely, i.e., the lateral dimensions $L_P$ of the respective luminescence conversion element 6 and of the first sub-region 15A are greater than or equal to the lateral dimensions $L_C$ of the light-emitting diode chips 3 and preferably two to three times as great as the lateral dimensions $L_C$ of the light-emitting diode chips 3, the limit values being included.

The second sub-region 15B is filled with a gas, in particular with air. The gas has a lower refractive index than the material of the light mixing element 13, which delimits the cavity 15, and in particular the second sub-region 15B thereof, towards the light outcoupling face 101.

Furthermore, unlike in the preceding examples, the outcoupling layer 14 is formed by a front edge region of the light mixing element 13. It comprises pattern units whose order of magnitude lies in the range of the lateral dimensions $L_C$ of the light-emitting diode chips 3. Each of the pattern units covers one light-emitting diode chip 3, for example, partially or completely.

In this case the pattern units are recesses, which are provided to deflect some of the primary light emitted by the light-emitting diode chips 3 and/or some of the secondary light emitted by the luminescence conversion elements 6 by total reflection. Such recesses are known, for example, in principle from U.S. Pat. No. 6,473,554 B1, the subject matter of which is hereby incorporated by reference. With such pattern units, particularly good light mixing may advantageously be achieved in the light mixing element 13, as well as a particularly small structural height $H_B$ for the lighting device.

Figure 6:
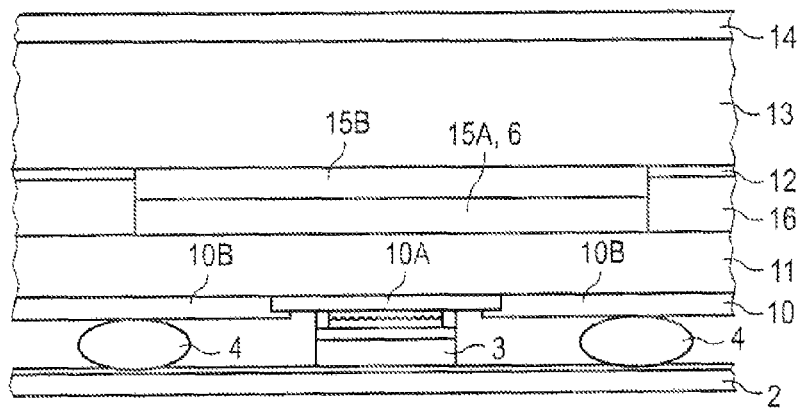
FIG. 6 shows a schematic cross-section through a portion of a lighting device according to a fifth example.

FIG. 6 shows a schematic cross-section through a portion of a lighting device according to a fifth example.

This differs from the fourth example in that the outcoupling layer 14 is configured as in the second example. In addition, the first sub-regions 15A of the cavities 15 are not enclosed laterally by the respective second sub-regions 15B. Instead, the first sub-regions 15A, and thus the luminescence conversion elements 6, fill the respective cavity 15 completely in the lateral direction.

Finally, the second parts 10B of the electrical connection layer 10 of the front carrier comprise Al instead of Ag and the front carrier 1 contains a light-diffusing and diffusely reflective layer 16. In this way, it is advantageously possible to dispense with an Ag reflector layer integrated with the electrical connection layer 10, which may bring with it a risk of impairment by oxidation.

The light-diffusing and diffusely reflective layer 16 is arranged between the carrier element 11 and the light mixing element 13. In this case, the cavities 15 of the front carrier 1 are delimited laterally by the diffuse reflective layer 16. The light-diffusing and diffusely reflective layer 16 comprises $TiO_2$ particles 161, for example, which are embedded in a matrix of a silicone material 162.

Figure 7:
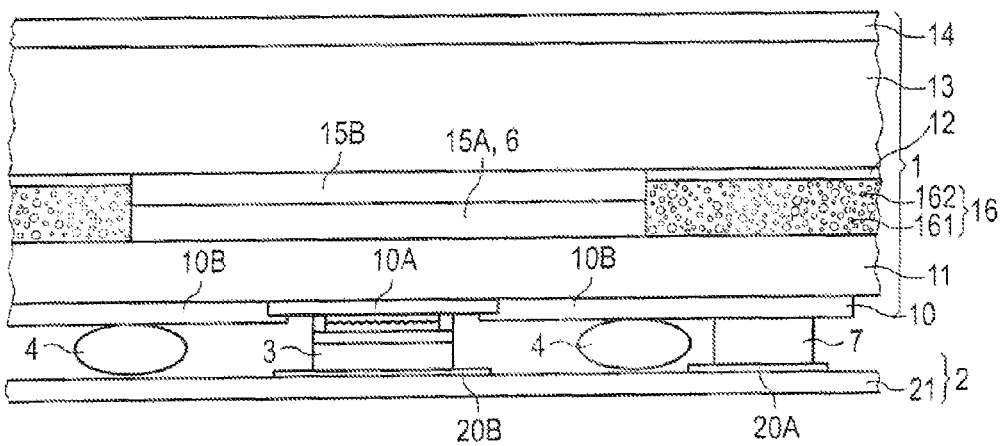
FIG. 7 shows a schematic cross-section through a portion of a lighting device according to a sixth example.

FIG. 7 shows a schematic cross-section through a portion of a lighting device according to a sixth example.

This differs from the fifth example in that bridge elements 7 are arranged between the front carrier 1 and the rear carrier 2. The bridge elements 7 have the same height $H_C$, for example, as the light-emitting diode chips 3 and are immobilized or attached in the same way as these by the carriers 1, 2. The bridge elements 7 are arranged, for example, in the lateral direction between the light-emitting diode chips 3. The bridge elements 7 are, for example, metal blocks, doped silicon blocks or metal-coated plastics blocks. In this way the light-emitting diode chips 3 are, for example, freely wirable.

In this case the rear carrier 2 comprises at least one first conductor track 20A connected for front contacting of the light-emitting diode chips by the bridge element 7 electrically conductively with the, in particular patterned, electrical connection layer 10 of the front carrier 1. At least one second electrical conductor track 20B of the rear carrier is provided for rear contacting of the light-emitting diode chips 3. The light-emitting diode chips 3 are preferably attached to the second electrical conductor track(s) 20B and the bridge elements 7 are attached to the first electrical conductor track(s) 20A.

Figure 8:
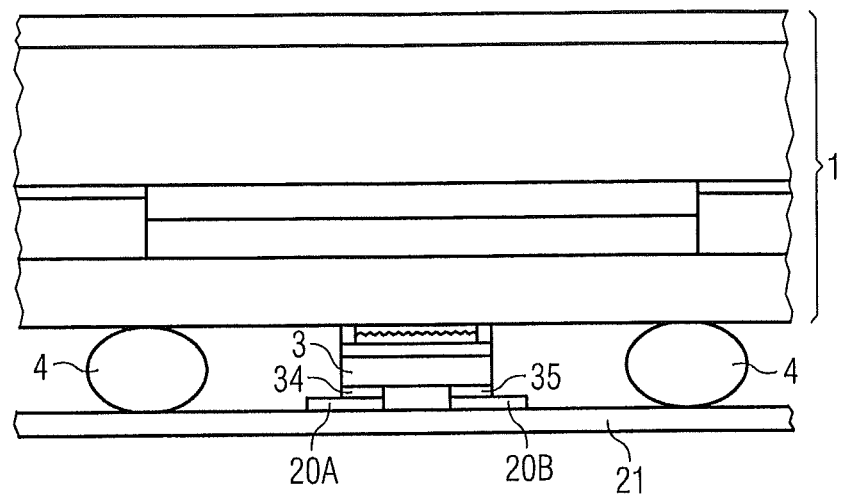
FIG. 8 shows a schematic cross-section through a portion of a lighting device according to a seventh example.

FIG. 8 shows a schematic cross-section through a portion of a lighting device according to a seventh example.

In this example the light-emitting diode chips 3 are configured both for n-side and for p-side contacting from the rear. For example, the first and second electrical contact layers 34, 35, or at least parts thereof, are applied to the rear of the light-generating semiconductor layer sequence 31, 32, 33. The first contact layer 34 is conveniently guided through the active layer 32. Such light-emitting diode chips 3 are known, for example, from WO 2008/131735 A1, the subject matter of which is incorporated by reference. Light-emitting diodes of the "flip chip" type, which are likewise known and will not therefore be explained in greater detail at this point, are also suitable for the lighting device according to this example.

Electrical contacting of the light-emitting diode chips proceeds in this example by the first and second conductor track(s) 20A, 20B of the rear carrier, each light-emitting diode chip 3 overlapping, for example, with a first and a second conductor track 20A, 20B. In this example, the front carrier 1 manner in particular does not comprise an electrical connection layer.

The description made with reference to examples does not restrict this disclosure to these examples. Rather, the disclosure encompasses any novel feature and any combination of features, including in particular any combination of features in the appended claims, even if the feature or combination is not itself explicitly indicated in the claims or examples.

The invention claimed is:

1. A lighting device comprising a front carrier, a rear carrier and a plurality of light-emitting diode chips which when in operation emits light and releases waste heat, wherein
   the rear carrier is covered at least in selected locations by the front carrier,
   the light-emitting diode chips are arranged between the rear carrier and the front carrier to form an array,
   the light-emitting diodes are contacted electrically by the rear and/or the front carrier and immobilized mechanically by the rear carrier and the front carrier,
   the front carrier is coupled thermally conductively to the light-emitting diode chips and comprises a light outcoupling face remote from the light-emitting diode chips, which light outcoupling face is configured to release some of the waste heat released by the light-emitting diode chips into the surrounding environment,
   each light-emitting diode chip is actuated with an electrical nominal power of 100 mW or less when the lighting device is in operation and has a light yield of 100 lm/W or more,
   distances between mutually adjacent light-emitting diode chips are sufficiently large for the array formed by the light-emitting diode chips to have an electrical power consumption relative to its base, on actuation of the light-emitting diode chips with the electrical nominal power, of less than or equal to 450 W/m$^2$, when the lighting device is in operation,
   distances between mutually adjacent light-emitting diode chips are sufficiently small for the array formed by the light-emitting diode chips to emit light, in plan view onto the light outcoupling face, with an average luminance of greater than or equal to 2000 Cd/m$^2$, on actuation of the light-emitting diode chips with the electrical nominal power when the lighting device is in operation and distances between mutually adjacent light-emitting diode chips are less than or equal to 2.5 times a distance between the light outcoupling face and the light-emitting diode chips,
   the light-emitting diode chips each comprise a contact layer facing the front carrier,
   the front carrier comprises an electrical connection layer which adjoins the contact layers,
   the rear carrier comprises at least one conductor track, which is provided for front electrical contacting of at least one of the light-emitting diode chips, and
   at least one electrical bridge element is arranged between the front carrier and the rear carrier, which produces electrical contact between the conductor track of the rear carrier and the electrical connection layer of the front carrier.

2. The lighting device according to claim 1, wherein the distance between the light outcoupling face and the light-emitting diode chips is less than or equal to 5 mm.

3. The lighting device according to claim 1, wherein the light-emitting diode chips have lateral dimensions of 300μm or less.

4. The lighting device according to claim 1, which is cooled without an additional heat sink by heat release at the light outcoupling face and at a rear outer face of the rear carrier.

5. The lighting device according to claim 1, wherein the front and the rear carriers are flexible.

6. The lighting device according to claim 1, whose structural height is less than or equal to 10 mm.

7. The lighting device according to claim 1, wherein an adhesion-promoting material is arranged in places between the front carrier and the rear carrier, by which material a tensile stress is achieved between the carriers.

8. The lighting device according to claim 1, wherein a refractive index matching material is arranged between the light-emitting diode chips and the front carrier.

9. The lighting device according to claim 1, wherein the front carrier encloses a plurality of mutually separate cavities, wherein each cavity overlaps with one of the light-emitting diode chips and contains a luminescence conversion element with a luminescent material.

10. The lighting device according to claim 1, wherein the front carrier encloses a plurality of mutually separate cavities, wherein
    each cavity overlaps with one of the light-emitting diode chips,
    a first sub-region (15A) of each cavity (15) facing the respective light-emitting diode chip contains a luminescence conversion element with a luminescent material, and
    a second sub-region of each cavity remote from the respective light-emitting diode chip is filled with a material which has a lower refractive index than the material of the front carrier, which delimits the cavity towards the light outcoupling face and comprises a curved surface.

11. The lighting device according to claim 9, wherein each cavity has lateral dimensions which are in each case less than or equal to three times a corresponding lateral dimension of the light-emitting diode chip with which the cavity overlaps.

12. The lighting device according to claim 1, wherein the front carrier contains a layer which reflects diffusely by scattering particles.

13. The lighting device according claim 1, wherein the contact layer is a light-transmitting layer and the electrical connection layer transmits light at least in selected locations.

14. The lighting device according to claim 1, wherein the light-emitting diode chips and the electrical bridge element are substantially the same height.

15. The lighting device according to claim 10, wherein each cavity has lateral dimensions which are in each case less than or equal to three times a corresponding lateral dimension of the light-emitting diode chip with which the cavity overlaps.

* * * * *